(12) United States Patent
Raita et al.

(10) Patent No.: US 7,633,351 B2
(45) Date of Patent: Dec. 15, 2009

(54) DIFFERENTIAL RING OSCILLATOR

(75) Inventors: Kazuhisa Raita, Kyoto (JP); Ichiro Yamane, Kyoto (JP); Yoshitaka Kitao, Kyoto (JP); Toshifumi Hamaguchi, Osaka (JP); Takahiro Inauchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 99 days.

(21) Appl. No.: 11/892,444

(22) Filed: Aug. 23, 2007

(65) Prior Publication Data
US 2008/0061894 A1 Mar. 13, 2008

(30) Foreign Application Priority Data
Aug. 25, 2006 (JP) ............................. 2006-229723

(51) Int. Cl.
*H03B 5/24* (2006.01)
*H03K 3/03* (2006.01)
*H03L 1/00* (2006.01)
*H03L 1/02* (2006.01)
*H03L 7/08* (2006.01)

(52) U.S. Cl. ............................. 331/176; 331/17; 331/57; 331/179

(58) Field of Classification Search .............. 331/1 A, 331/8, 16–18, 25, 34, 36 C, 57, 175, 176, 331/177 R, 177 V, 179
See application file for complete search history.

(56) References Cited

U.S. PATENT DOCUMENTS

| | | | | |
|---|---|---|---|---|
| 5,359,301 | A | * | 10/1994 | Candage ........................ 331/57 |
| 5,418,498 | A | * | 5/1995 | DeVito et al. .................. 331/57 |
| 5,428,321 | A | * | 6/1995 | Yoshida et al. ............... 332/109 |
| 6,452,458 | B1 | | 9/2002 | Tanimoto |
| 7,126,431 | B2 | | 10/2006 | Mintchev et al. |

FOREIGN PATENT DOCUMENTS

JP 11-112298 A 4/1999

\* cited by examiner

*Primary Examiner*—David Mis
(74) *Attorney, Agent, or Firm*—McDermott Will & Emery LLP

(57) ABSTRACT

A differential amplifier circuit includes: a differential transistor pair composed of first and second transistors; a first resistance connected to a junction point of the first and second transistors at one terminal and to a first voltage node at the other terminal; second and third resistances provided between the first and second transistors, respectively, and a second voltage node; and first and second passive circuits respectively connected to the second and third resistances, the load characteristics of the passive circuits changing according to a control signal supplied. A ring oscillator is composed of a plurality of such differential amplifier circuits connected in a loop.

14 Claims, 15 Drawing Sheets

CTL[0:n-1]

DIFFERENTIAL RING OSCILLATOR

BACKGROUND OF THE INVENTION

1. Field of the Invention

The present invention relates to a ring oscillator, and more particularly to an oscillator for generating an operation clock signal used in microcomputers and the like and a semiconductor integrated circuit and an electronic device including the same.

2. Description of the Related Art

In microcomputers and the like, a desired operation frequency is generally obtained by lowering the frequency of an original clock signal inputted from an external quartz oscillator with an internal frequency divider. In view of the present situation that microcomputers have become inexpensive, however, the above way of providing an external quartz oscillator to obtain an operation clock signal for a microcomputer has no cost merit. Also, an input buffer section of a microcomputer that receives an original clock signal from an external quartz oscillator is still required to operate at high speed, and this has become a cause of blocking reduction in the power consumption of microcomputers. Therefore, from the standpoints of low cost and low power consumption, microcomputers and the like preferably incorporate therein an independent oscillator that generates a comparatively low-speed operation clock signal. As such an independent oscillator, a differential ring oscillator composed of a plurality of reverse delay circuits connected in a loop may be used.

While a differential ring oscillator is less susceptive to variations in power supply voltage and ambient temperature and the like and therefore attains sufficiently high oscillation frequency precision, it is necessary to provide a bias circuit for adjusting the bias of each reverse delay circuit. In consideration of the cost, an oscillator incorporated in a microcomputer and the like is preferably simpler in configuration. Also, for improvement of the yield, an oscillator is preferably provided with a mechanism for compensating fabrication variations.

SUMMARY OF THE INVENTION

An object of the present invention is implementing a ring oscillator that can obtain sufficient oscillation frequency precision with a comparatively simple configuration and can correct deflections in oscillation frequency caused by fabrication variations, and providing a semiconductor integrated circuit and electronic device provided with such a ring oscillator.

The ring oscillator of the present invention is a ring oscillator including a plurality of differential amplifier circuits connected in a loop, each of the differential amplifier circuits including: a differential transistor pair composed of first and second transistors; a first resistance connected to a junction point of the first and second transistors at one terminal and to a first voltage node at the other terminal; and second and third resistances provided between the first and second transistors, respectively, and a second voltage node. Each of the plurality of differential amplifier circuits may further include first and second passive circuits connected to the second and third resistances, respectively, the load characteristics of the passive circuits changing according to a control signal supplied. Otherwise, each of the plurality of differential amplifier circuits may further include a variable resistance circuit connected to the first resistance, the resistance value of the variable resistance circuit changing according to a control signal supplied.

According to the invention described above, a current flowing to the first resistance connected to the first voltage node is supplied to each of the differential amplifier circuits constituting the ring oscillator. In other words, a simple configuration composed of only the first resistance can implement a current source for each differential amplifier circuit without the necessity of especially providing a transistor as a current bias source. Moreover, by appropriately changing the load characteristic of a passive circuit, fine adjustment can be made on the oscillation frequency of the ring oscillator. Deflections in oscillation frequency caused by fabrication variations can therefore be corrected, to enable generation of a highly precise oscillating signal.

Alternatively, the ring oscillator of the present invention is a ring oscillator including a plurality of differential amplifier circuits connected in a loop, the ring oscillator including a current-voltage converter circuit having a diode-connected transistor and a resistance connected to the transistor for converting a current flowing to the resistance to a voltage with the transistor, wherein each of the differential amplifier circuits includes: a differential transistor pair composed of first and second transistors; a voltage-current converter circuit for converting the voltage supplied from the current-voltage converter circuit to a current and supplying the current to a junction point of the first and second transistors; and first and second resistances provided between the first and second transistors, respectively, and a predetermined voltage node, and the voltage-current converter circuit has a plurality of transistors connected with the transistor of the current-voltage converter circuit in a current mirror manner, and changes the current mirror ratio according to a control signal supplied.

According to the invention described above, the voltage-current converter circuit can implement a current source large in internal resistance with a small circuit area, and thus the circuit scale and power consumption of the ring oscillator can be reduced. Moreover, by appropriately changing the current supply amount of the voltage-current converter circuit, fine adjustment can be made on the oscillation frequency of the ring oscillator. Deflections in oscillation frequency caused by fabrication variations can therefore be corrected, to enable generation of a highly precise oscillating signal.

Alternatively, the ring oscillator of the present invention is a ring oscillator including a plurality of differential amplifier circuits connected in a loop, each of the differential amplifier circuits including: a differential transistor pair composed of first and second transistors; third and fourth transistors respectively connected to the first and second transistors for operating complementary to the first and second transistors; and a first resistance provided between a junction point of the first and third transistors and a junction point of the second and fourth transistors. Each of the plurality of differential amplifier circuits may further include a passive circuit connected to the first resistance, the load characteristic of the passive circuit changing according to a control signal supplied. Otherwise, each of the plurality of differential amplifier circuits may further include: a second resistance connected to a junction point of the first and second transistors at one terminal and to a predetermined voltage node at the other terminal; and a variable resistance circuit connected to the second resistance, the resistance value of the variable resistance circuit changing according to a control signal supplied.

According to the invention described above, the direction of the current flowing through the first resistance provided between the junction point of the first and third transistors and the junction point of the second and fourth transistors is reverse-controlled, to generate an output differential signal of each differential amplifier circuit. That is, the number of resistances required for generation of an output differential signal can be reduced. Moreover, by appropriately changing the load characteristic or resistance value of the passive circuit or the variable resistance circuit, fine adjustment can be made on the oscillation frequency of the ring oscillator. Deflections in oscillation frequency caused by fabrication variations can therefore be corrected, to enable generation of a highly precise oscillating signal.

Alternatively, the ring oscillator of the present invention is a ring oscillator including a plurality of differential amplifier circuits connected in a loop, the ring oscillator including a current-voltage converter circuit having a diode-connected transistor and a resistance connected to the transistor for converting a current flowing to the resistance to a voltage with the transistor, wherein each of the differential amplifier circuits includes: a differential transistor pair composed of first and second transistors; a voltage-current converter circuit for converting the voltage supplied from the current-voltage converter circuit to a current and supplying the current to a junction point of the first and second transistors; third and fourth transistors respectively connected to the first and second transistors for operating complementary to the first and second transistors; and a resistance provided between a junction point of the first and third transistors and a junction point of the second and fourth transistors, and the voltage-current converter circuit has a plurality of transistors connected with the transistor of the current-voltage converter circuit in a current mirror manner, and changes the current mirror ratio according to a control signal supplied.

According to the invention described above, the voltage-current converter circuit can implement a current source large in internal resistance with a small circuit area. Also the number of resistances required for generation of an output differential signal can be reduced. The circuit scale of the ring oscillator can therefore be further reduced. Moreover, by appropriately changing the current supply amount of the voltage-current converter circuit, fine adjustment can be made on the oscillation frequency of the ring oscillator. Deflection in oscillation frequency caused by fabrication variations can therefore be corrected, to enable generation of a highly precise oscillating signal.

Alternatively, the ring oscillator of the present invention is a ring oscillator including: an oscillation section comprising a plurality of differential amplifier circuits connected in a loop; a first amplifier receiving a differential signal outputted from the oscillation section for amplifying the received differential signal to output a single signal; a DC cutoff circuit receiving the signal outputted from the first amplifier for cutting off a DC component included in the received signal; and a second amplifier receiving a signal outputted from the DC cutoff circuit for amplifying the received signal to a predetermined amplitude.

According to the invention described above, even if the amplitude of the oscillating signal is small and the amplitude center is deviated from the position of ½ of the power supply voltage, it is possible to generate a signal oscillating over the entire width between the power supply voltage and the ground voltage with the position of ½ of the power supply voltage as the center. In this way, a ring oscillator supplying a stable oscillating signal independent of the power supply voltage can be implemented with a comparatively simple circuit configuration.

The semiconductor integrated circuit of the present invention includes: any of the ring oscillators described above; a phase comparator for comparing a phase of an output signal of the ring oscillator with a phase of a reference signal; a counter for counting up or down based on the result of the phase comparison, the counter starting the counting from an initial value once instructed to start counting while retaining the current count value once instructed to stop counting; and a control signal generation section for generating the control signal according to the count value of the counter.

According to the invention described above, deflections in oscillation frequency caused by fabrication variations of ring oscillators can be automatically corrected.

Preferably, the semiconductor integrated circuit described above further includes a control section for instructing the counter to start or stop counting and transferring a count value between the counter and an internal or external memory when the counting of the counter is at rest.

According to the invention described above, parameters for correcting deflections in the oscillation frequency of ring oscillators can be stored for individual products, and thus any ring oscillator can generate uniform highly-precise oscillating signals irrespective of fabrication variations, if any. This permits improvement in the yield of semiconductor integrated circuits provided with such ring oscillators.

As described above, according to the present invention, ring oscillators that are excellent in robustness against variations in power supply voltage, ambient temperature and the like and can attain sufficient oscillation frequency precision can be implemented with a comparatively simple configuration. Also, deflections in the oscillation frequency of ring oscillators caused by fabrication variations can be corrected. Accordingly, electronic devices such as microcomputers incorporating such ring oscillators can attain lower power consumption. In addition, with no need to provide an external quartz oscillator especially, cost reduction of the entire system can be attained, and also no oscillation terminal for receiving an external oscillating signal will be necessary in the electronic devices incorporating such ring oscillators.

DESCRIPTION OF THE PREFERRED EMBODIMENTS

Hereinafter, preferred embodiments of the present invention will be described with reference to the accompanying drawings.

Embodiment 1

Figure 1:
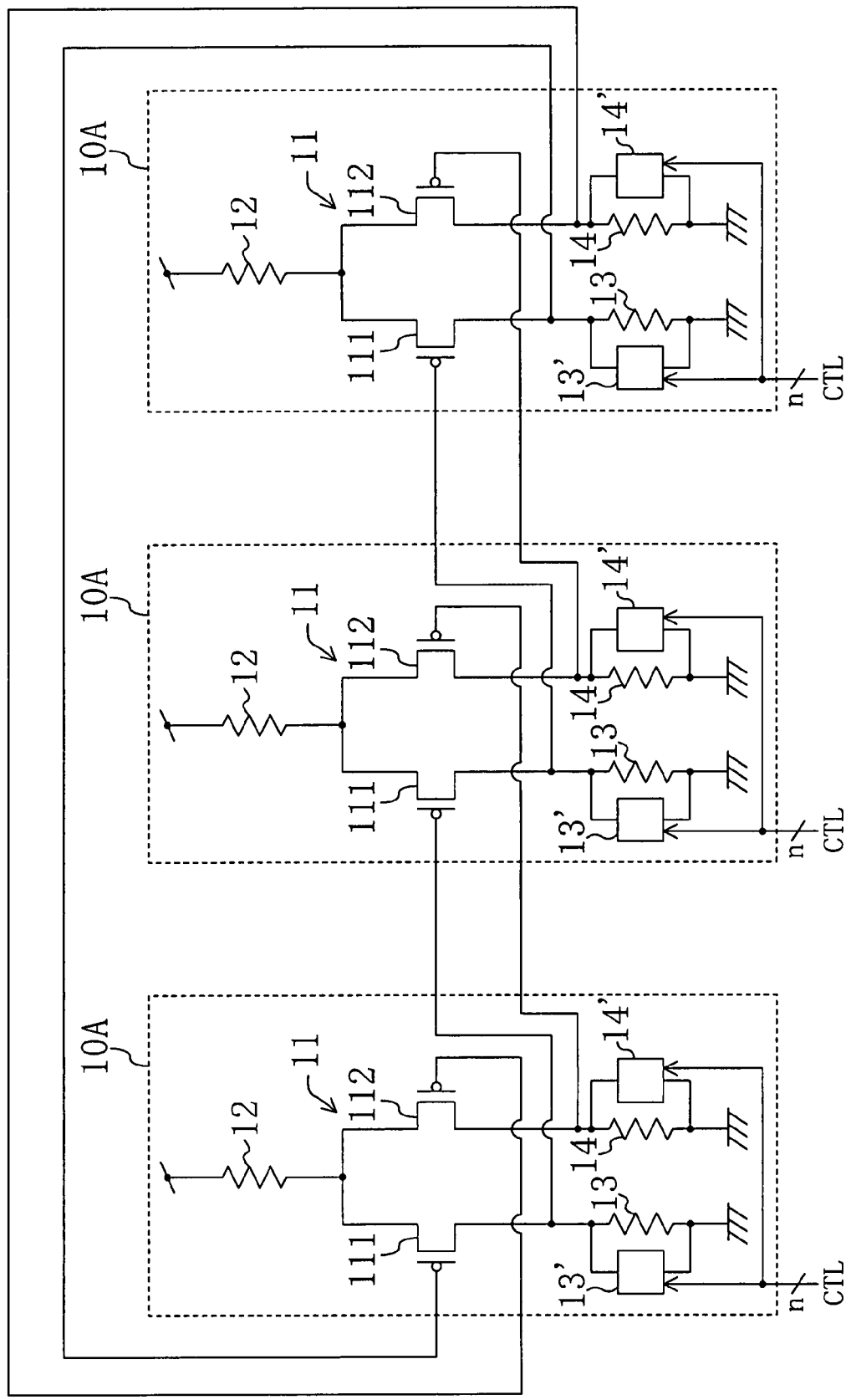
FIG. 1 is a view showing a configuration of a ring oscillator of Embodiment 1.

FIG. 1 shows a configuration of a ring oscillator of Embodiment 1. The ring oscillator of this embodiment is composed of three differential amplifier circuits 10A connected in a loop. Each of the differential amplifier circuits 10A includes a differential transistor pair 11, resistances 12, 13 and 14 and passive circuits 13' and 14'. The differential transistor pair 11 is composed of PMOS transistors 111 and 112 whose sources are connected to each other and whose gates receive a differential signal. The resistance 12 is connected to the junction point of the PMOS transistors 111 and 112 at one terminal and to the power supply voltage node at the other terminal. The resistance 13 is connected to the drain of the PMOS transistor 111 at one terminal and to the ground voltage node at the other terminal. The resistance 14 is connected to the drain of the PMOS transistor 112 at one terminal and to the ground voltage node at the other terminal. The passive circuits 13' and 14' are respectively connected in parallel with the resistances 13 and 14. The passive circuits 13' and 14' change their load characteristics with an n-bit control signal CTL.

Figure 2:
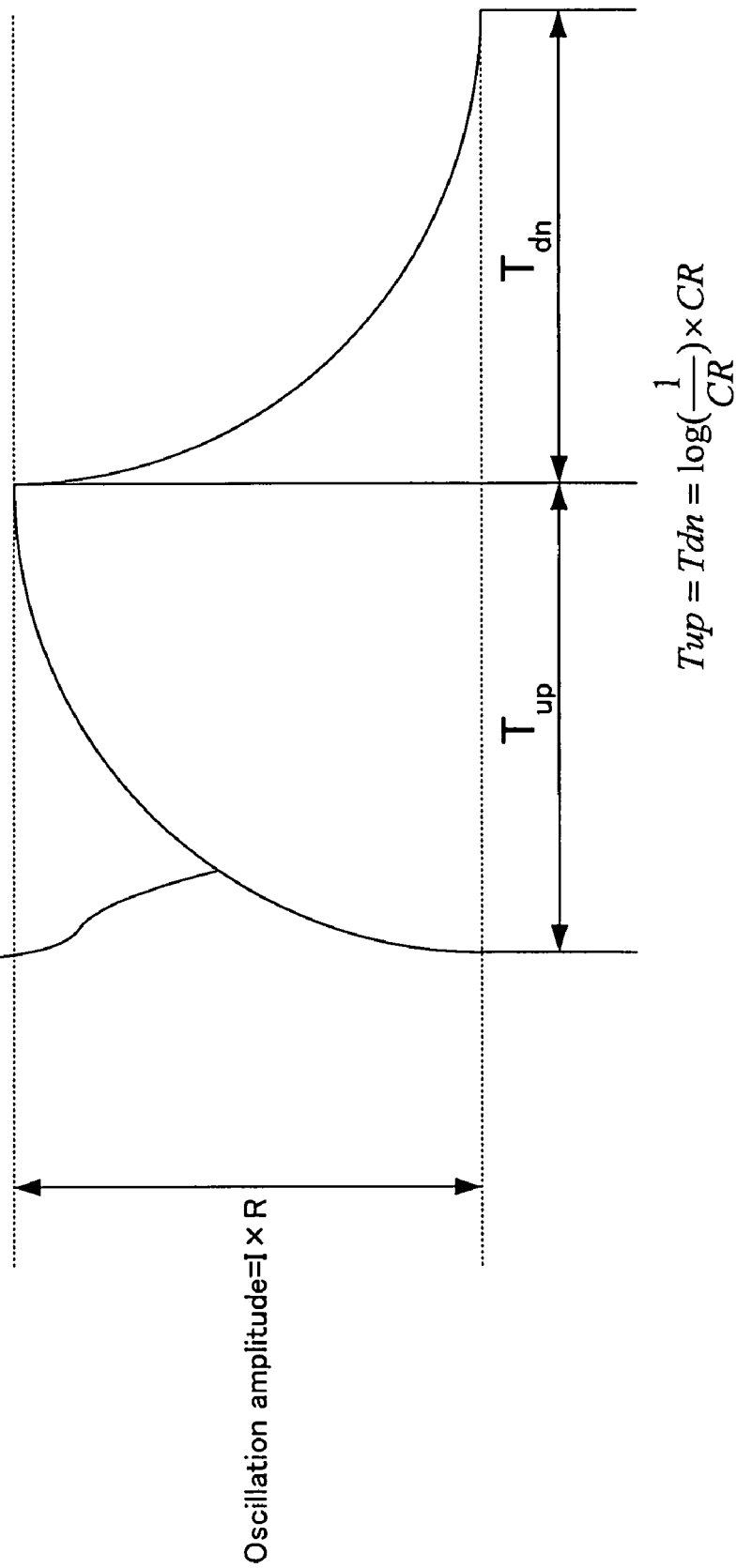
FIG. 2 is a view for demonstrating the delay time in a differential amplifier circuit shown in FIG. 1.

The delay time in each differential amplifier circuit 10A will be described with reference to FIG. 2. The oscillation amplitude of the differential amplifier circuit 10A is expressed by I×R wherein I is the current flowing to the resistance 12 and R is the resistance value of the circuit portion composed of the resistance 13 and the passive circuit 13' and the circuit portion composed of the resistance 14 and the passive circuit 14'. Also, the differential signal outputted from the differential amplifier circuit 10A is expressed by $$f(t)=I/C \times \exp(-t/C/R)$$

wherein C is the capacitance value of capacitance elements or parasitic capacitances in the two circuit portions. In this relation, the delay time τ in the differential amplifier circuit 10A is determined with the time at which the output differential signal f(t) becomes I×R. The delay time τ is therefore expressed by $$\tau = 2 \log(1/C/R) \times CR.$$

That is, the delay time τ in the differential amplifier circuit 10A is determined with the resistance value R and capacitance value C of the circuit portion composed of the resistance 13 and the passive circuit 13' and the circuit portion composed of the resistance 14 and the passive circuit 14', irrespective of the current I flowing to the resistance 12. This indicates that the oscillation frequency of the ring oscillator is not affected by variations in the current flowing to the resistance 12 in each differential amplifier circuit 10A, if any. In other words, this implies that the current supplied to the differential transistor pair 11 is not necessarily highly precise. Accordingly, as in this embodiment, the current source for the differential transistor pair 11 can be of a simple configuration having only the resistance 12 connected to the power supply voltage node without especially providing a bias circuit.

Figure 3:
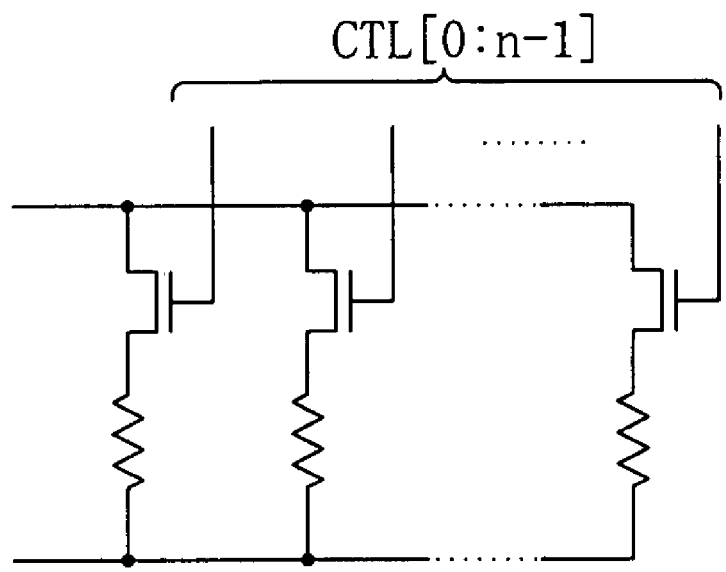
FIG. 3 is a view showing a configuration of a passive circuit made of a variable resistance circuit.
Figure 4:
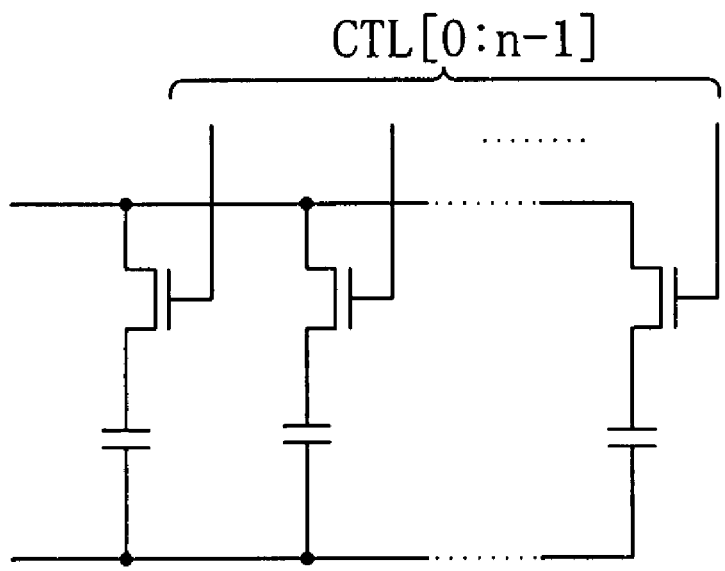
FIG. 4 is a view showing a configuration of a passive circuit made of a variable capacitance circuit.

While the oscillation period of this ring oscillator is 6τ, that is, the oscillation frequency is τ/6, the oscillation frequency can be adjusted by changing the control signal CTL. FIG. 3 shows an example of the passive circuits 13' and 14' in the form of a variable resistance circuit. In this configuration, switching transistors are turned ON/OFF in response to the n-bit control signal CTL to thereby change the number of parallel-connected resistance elements, and with this change, the resistance value of the entire circuit changes. Likewise, FIG. 4 shows an example of the passive circuits 13' and 14' in the form of a variable capacitance circuit. With this configuration, switching transistors are turned ON/OFF in response to the n-bit control signal CTL to thereby change the number of parallel-connected capacitance elements, and with this change, the capacitance value of the entire circuit changes. More specifically, as the capacitance value of the passive circuits 13' and 14' is greater, the oscillation frequency of the ring oscillator is lower.

The electrical properties of the plurality of resistances or capacitances of the variable resistance circuit or the variable capacitance circuit may be equal to or different from one another. If the resistance or capacitance values of the resistances or the capacitances are equal to one another, the resistance or capacitance value of the passive circuits 13' and 14' changes in n stages. If the resistance or capacitance values are different from one another, the resistance or capacitance value of the passive circuit 13' and 14' changes in an integer power of 2 ($2^n$) stages.

Thus, in this embodiment, a ring oscillator capable of oscillating stably without being affected by variations in power supply voltage and temperature and the like can be implemented with a comparatively simple configuration. Also, the oscillation frequency of the ring oscillator can be adjusted by appropriately adjusting the resistance or capacitance value of the passive circuits. This makes it possible to compensate fabrication variations to improve the yield.

All the resistances 12, 13 and 14 are preferably negative resistance elements having a negative characteristic against temperature variations. The resultant ring oscillator can improve in the robustness against temperature variations.

The number of differential amplifier circuits 10A connected in a loop is not limited to three, but any given number of differential amplifier circuits may be connected. As the number of differential amplifier circuits 10A is greater, the oscillation frequency of the ring oscillator will be lower.

Embodiment 2

Figure 5:
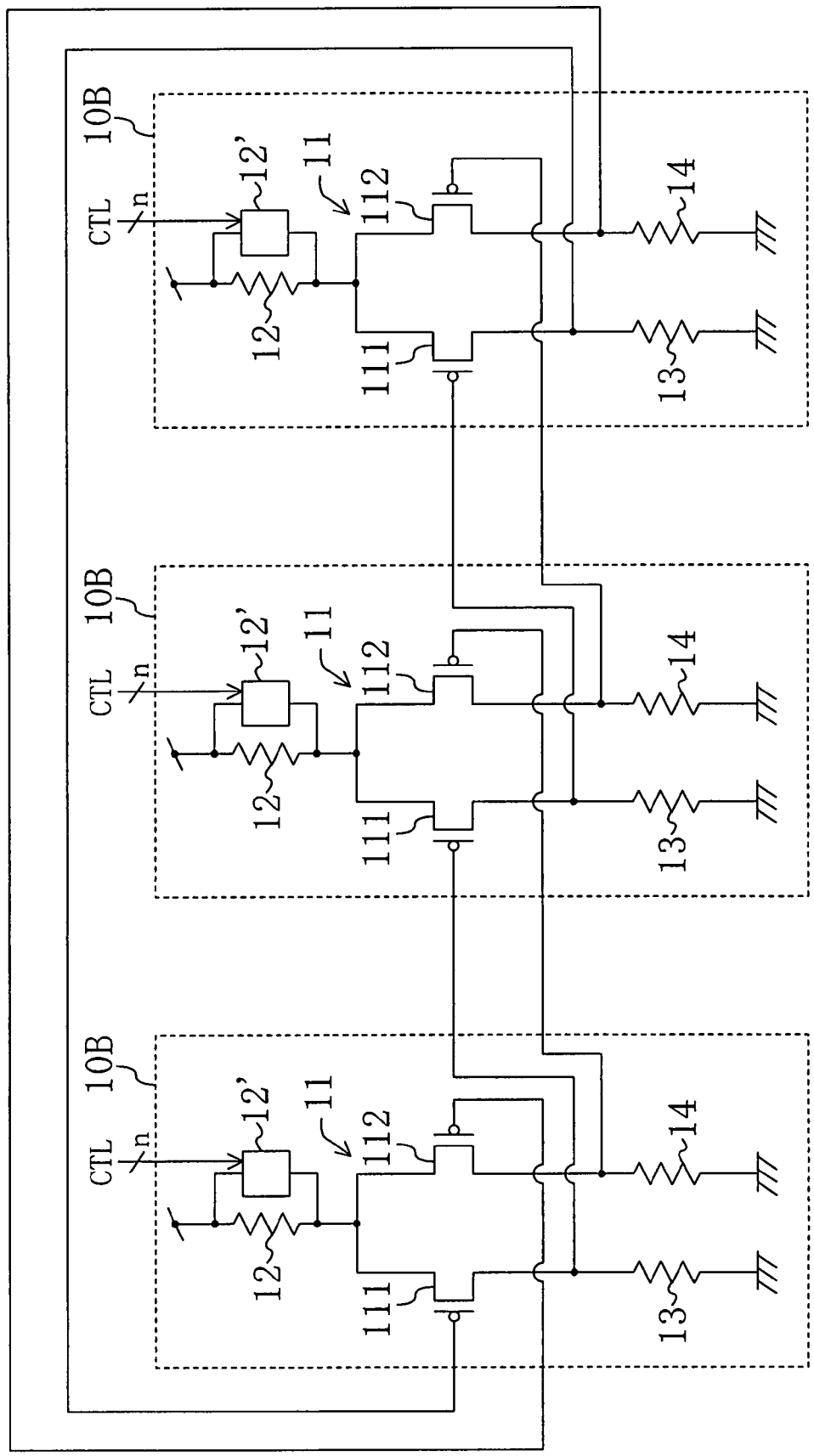
FIG. 5 is a view showing a configuration of a ring oscillator of Embodiment 2.

FIG. 5 shows a configuration of a ring oscillator of Embodiment 2 of the present invention. The ring oscillator of this embodiment is composed of three differential amplifier circuits 10B connected in a loop. Each of the differential amplifier circuits 10B is different from the differential amplifier circuit 10A shown in FIG. 1 in that the passive circuits 13' and 14' are omitted and instead a passive circuit 12' is provided in parallel with the resistance 12.

The passive circuit 12' can be made of the variable resistance circuit shown in FIG. 3. With the passive circuit 12' made of the variable resistance circuit being connected in parallel with the resistance 12, the combined resistance value becomes small. This increases the capacity of current supply to the resistances 13 and 14, and thus the oscillation frequency of the ring oscillator becomes higher. The oscillation frequency of the ring oscillator will further become higher as the resistance value of the passive circuit 12' is made smaller.

Also, the oscillation amplitude of the ring oscillator can be adjusted by changing the resistance value of the passive circuit 12'.

Thus, in this embodiment, a ring oscillator capable of oscillating stably without being affected by variations in power supply voltage and temperature and the like can be implemented with a comparatively simple configuration. Also, the oscillation frequency of the ring oscillator can be adjusted by appropriately adjusting the resistance value of the passive circuit. This makes it possible to compensate fabrication variations to improve the yield.

Embodiment 3

Figure 6:
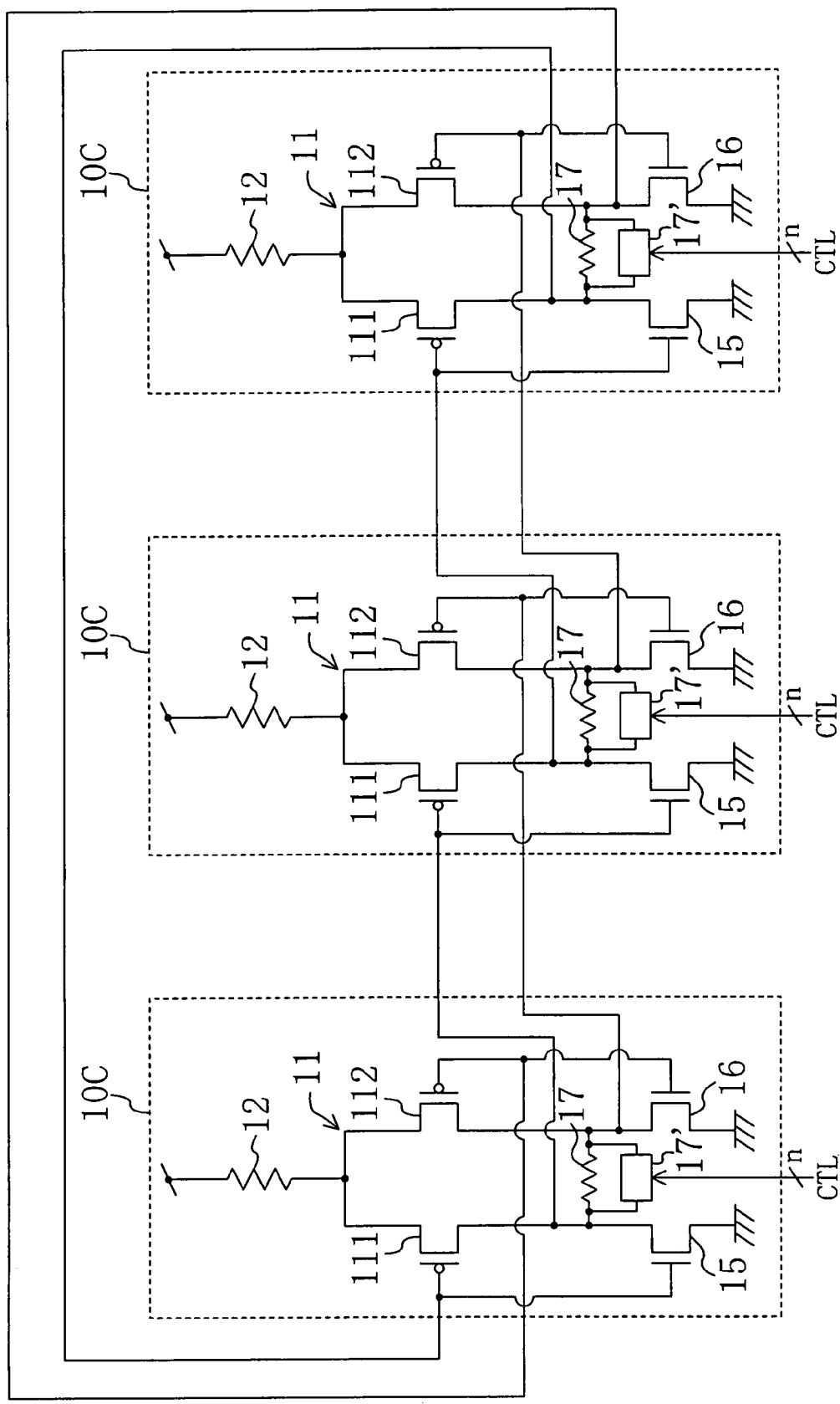
FIG. 6 is a view showing a configuration of a ring oscillator of Embodiment 3.

FIG. 6 shows a configuration of a ring oscillator of Embodiment 3 of the present invention. The ring oscillator of this embodiment is composed of three differential amplifier circuits 10C connected in a loop. Each of the differential amplifier circuits 10C is different from the differential amplifier circuit 10A shown in FIG. 1 in that NMOS transistors 15 and 16 are respectively provided in place of the circuit portion composed of the resistance 13 and the passive circuit 13' and the circuit portion composed of the resistance 14 and the passive circuit 14' and that a resistance 17 and a passive circuit 17' are newly provided to be connected to the junction point of the PMOS transistor 111 and the NMOS transistor 15 at one terminal and to the junction point of the PMOS transistor 112 and the NMOS transistor 16 at the other terminal.

A same signal is supplied to the gate of the NMOS transistor 15 and the gate of the PMOS transistor 111. Likewise, a same signal is supplied to the gate of the NMOS transistor 16 and the gate of the PMOS transistor 112. With this configuration, therefore, when high-level and low-level signals are respectively supplied to the PMOS transistors 111 and 112, the PMOS transistor 112 and the NMOS transistor 15 are turned ON, allowing leftward current flow through the resistance 17 and the passive circuit 17'. Contrarily, when low-level and high-level signals are respectively supplied to the PMOS transistors 111 and 112, the PMOS transistor 111 and the NMOS transistor 16 are turned ON, allowing rightward current flow through the resistance 17 and the passive circuit 17'. In other words, the direction of the current flowing through the resistance 17 and the passive circuit 17' is reverse-controlled, to thereby generate an output differential signal.

The passive circuit 17' can be composed of the variable resistance circuit shown in FIG. 3 or the variable capacitance circuit shown in FIG. 4. As the capacitance value of the passive circuit 17' is greater, the oscillation frequency of the ring oscillator will be lower.

Thus, in this embodiment, the number of resistances and passive circuits can be reduced compared with the ring oscillator of Embodiment 1. The circuit scale can therefore be reduced.

The resistance 17 is preferably a negative resistance element having a negative characteristic against temperature variations. The resultant ring oscillator can improve in the robustness against temperature variations.

Embodiment 4

Figure 7:
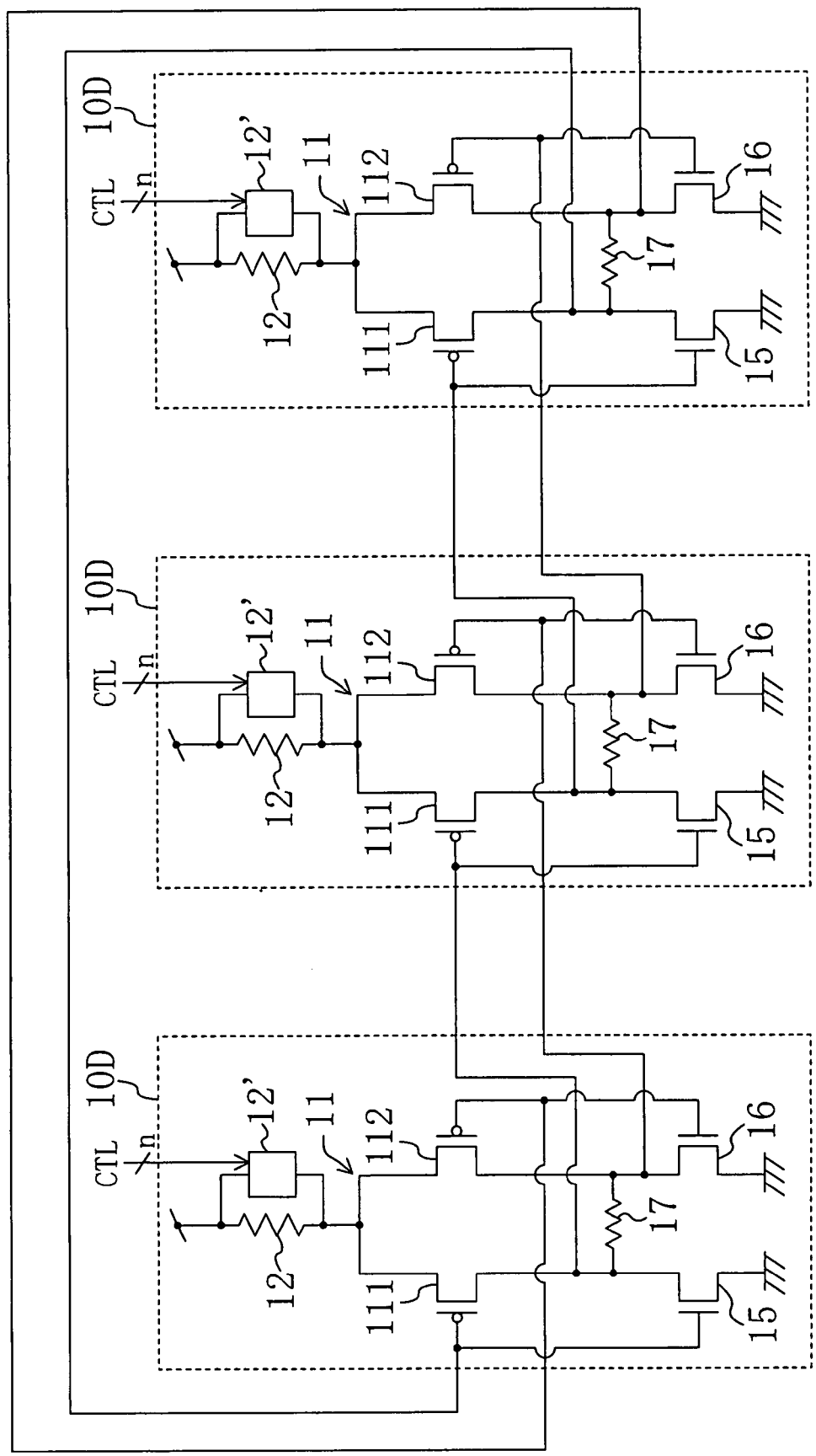
FIG. 7 is a view showing a configuration of a ring oscillator of Embodiment 4.

FIG. 7 shows a configuration of a ring oscillator of Embodiment 4 of the present invention. The ring oscillator of this embodiment is composed of three differential amplifier circuits 10D connected in a loop. Each of the differential amplifier circuits 10D is different from the differential amplifier circuit 10C shown in FIG. 6 in that the passive circuit 17' is omitted and instead a passive circuit 12' is newly provided in parallel with the resistance 12.

The passive circuit 12' can be made of the variable resistance circuit shown in FIG. 3. With the passive circuit 12' made of the variable resistance circuit being connected in parallel with the resistance 12, the combined resistance value will be small. This increases the capacity of current supply to the resistance 17, and thus the oscillation frequency of the ring oscillator becomes higher. The oscillation frequency of the ring oscillator will further become higher as the resistance value of the passive circuit 12' is made smaller. Also, the oscillation amplitude of the ring oscillator can be adjusted by changing the resistance value of the passive circuit 12'.

Thus, in this embodiment, the number of resistances and passive circuits can be reduced compared with the ring oscillator of Embodiment 2. The circuit scale can therefore be reduced.

Embodiment 5

Figure 8:
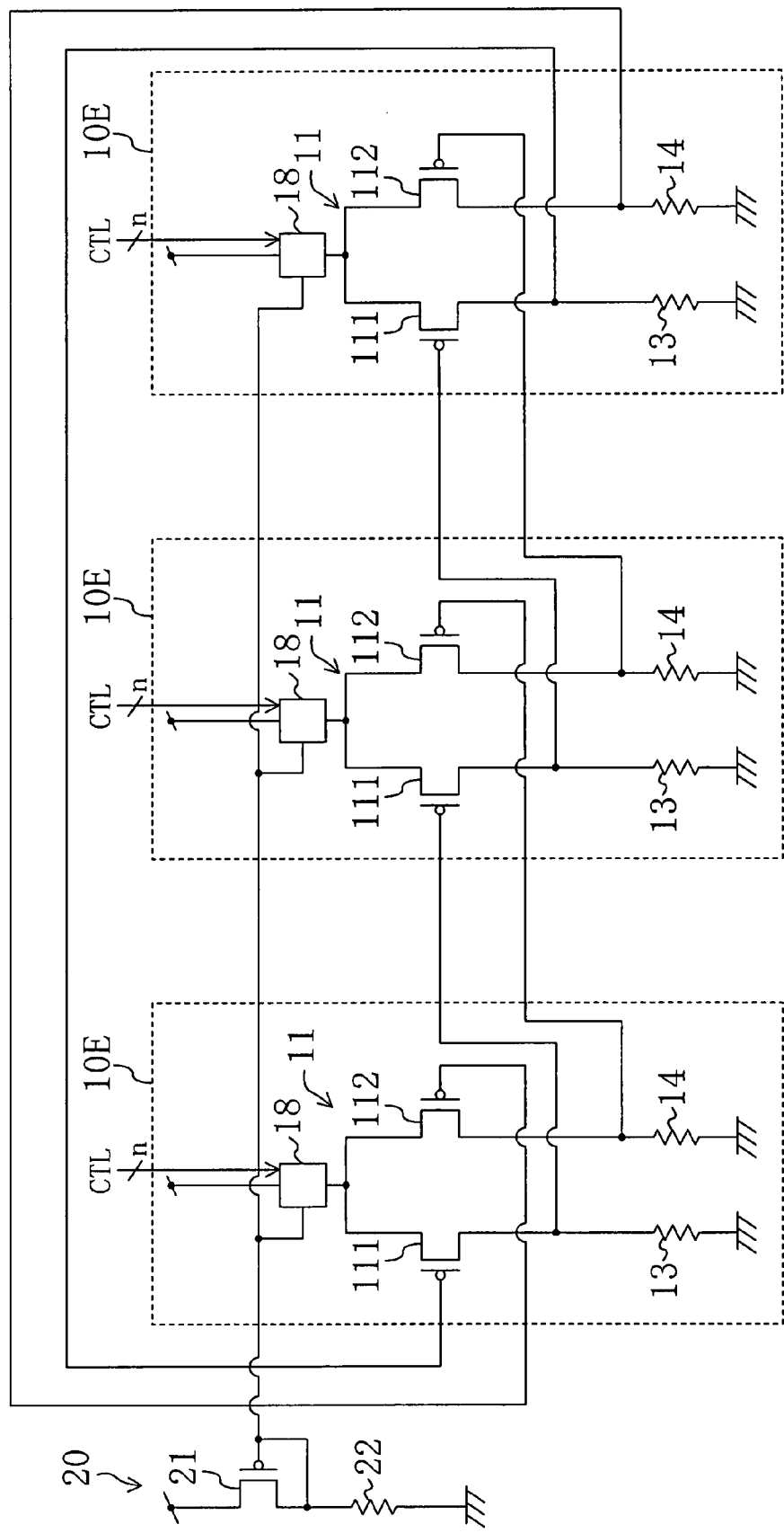
FIG. 8 is a view showing a configuration of a ring oscillator of Embodiment 5.

FIG. 8 shows a configuration of a ring oscillator of Embodiment 5 of the present invention. The ring oscillator of this embodiment is composed of three differential amplifier circuits 10E connected in a loop. Each of the differential amplifier circuits 10E is different from the differential amplifier circuit 10B shown in FIG. 5 in that a voltage-current (VI) converter circuit 18 is provided in place of the circuit portion composed of the resistance 12 and the passive circuit 12'. Also, the ring oscillator of this embodiment includes a current-voltage (IV) converter circuit 20. The IV converter circuit 20 includes a diode-connected PMOS transistor 21 and a resistance 22 connected to the transistor 21. A current flowing to the resistance 22 is converted to a voltage with the PMOS transistor 21.

Figure 9:
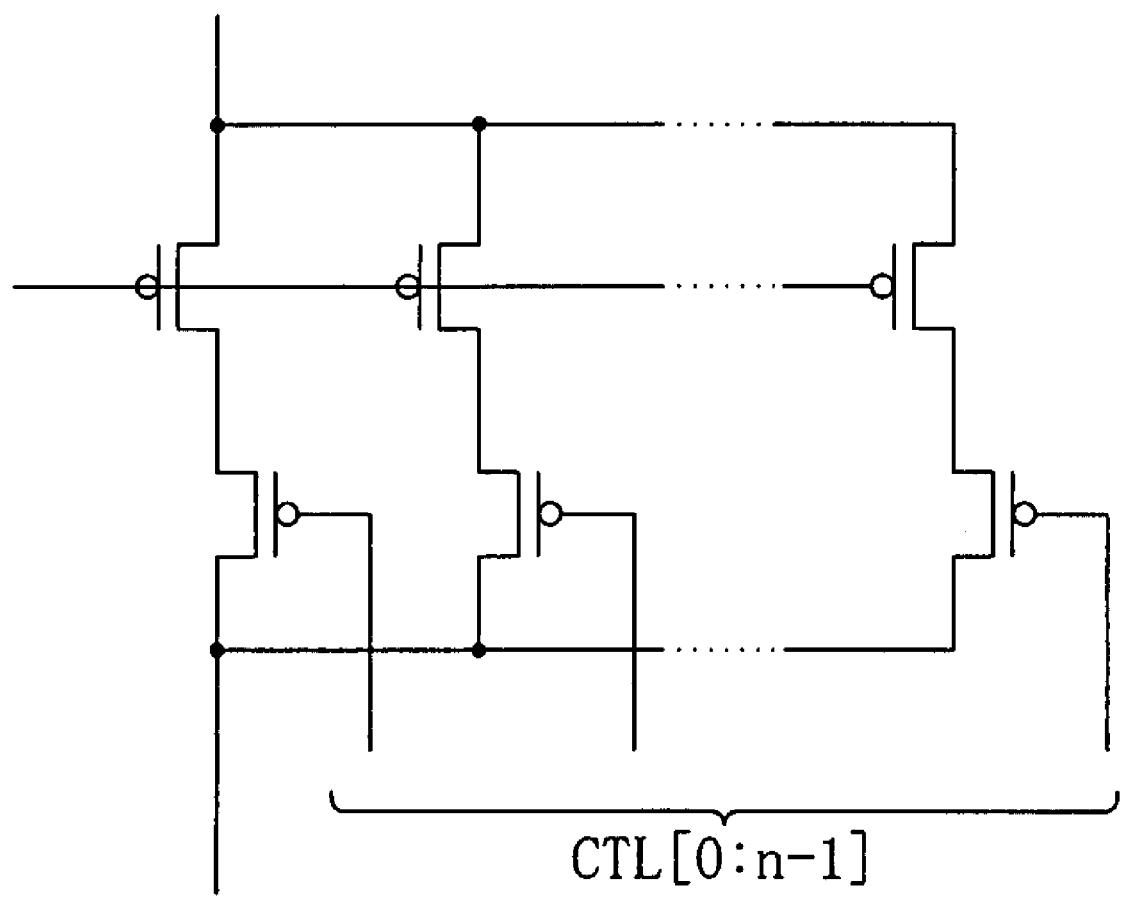
FIG. 9 is a view showing a configuration of a voltage-current converter circuit.

The VI converter circuit 18 converts the voltage supplied from the IV converter circuit 20 to a current and supplies the resultant current to the junction point of the PMOS transistors 111 and 112. Specifically, the VI converter circuit 18 is composed of a plurality of PMOS transistors connected to the PMOS transistor 21 in a current mirror manner. FIG. 9 shows an example of configuration of the VI converter circuit 18, in which switching transistors are turned ON/OFF in response to the n-bit control signal CTL to thereby change the number of parallel-connected PMOS transistors, and with this change, the current mirror ratio changes. More specifically, as the number of parallel-connected PMOS transistors is greater, that is, as the current mirror ratio is greater, the current supplied to the differential amplifier circuit 10E becomes greater, and this increases the oscillation amplitude of the ring oscillator.

The electrical properties of the plurality of PMOS transistors of the VI converter circuit 18 may be equal to or different from one another. If the electrical properties are equal to one another, the current supply amount of the VI converter circuit 18 changes in n stages. If the electrical properties are different from one another, the current supply amount of the VI converter circuit 18 changes in an integer power of 2 ($2^n$) stages.

In Embodiments 1 to 4 described above, the resistance value of the resistance 12 must be sufficiently large to reduce the power consumption of the differential amplifier circuit, and this is a cause of increase in circuit scale. In this embodiment, however, a large current can be supplied to the differential amplifier circuit with a comparatively small circuit scale.

Embodiment 6

Figure 10:
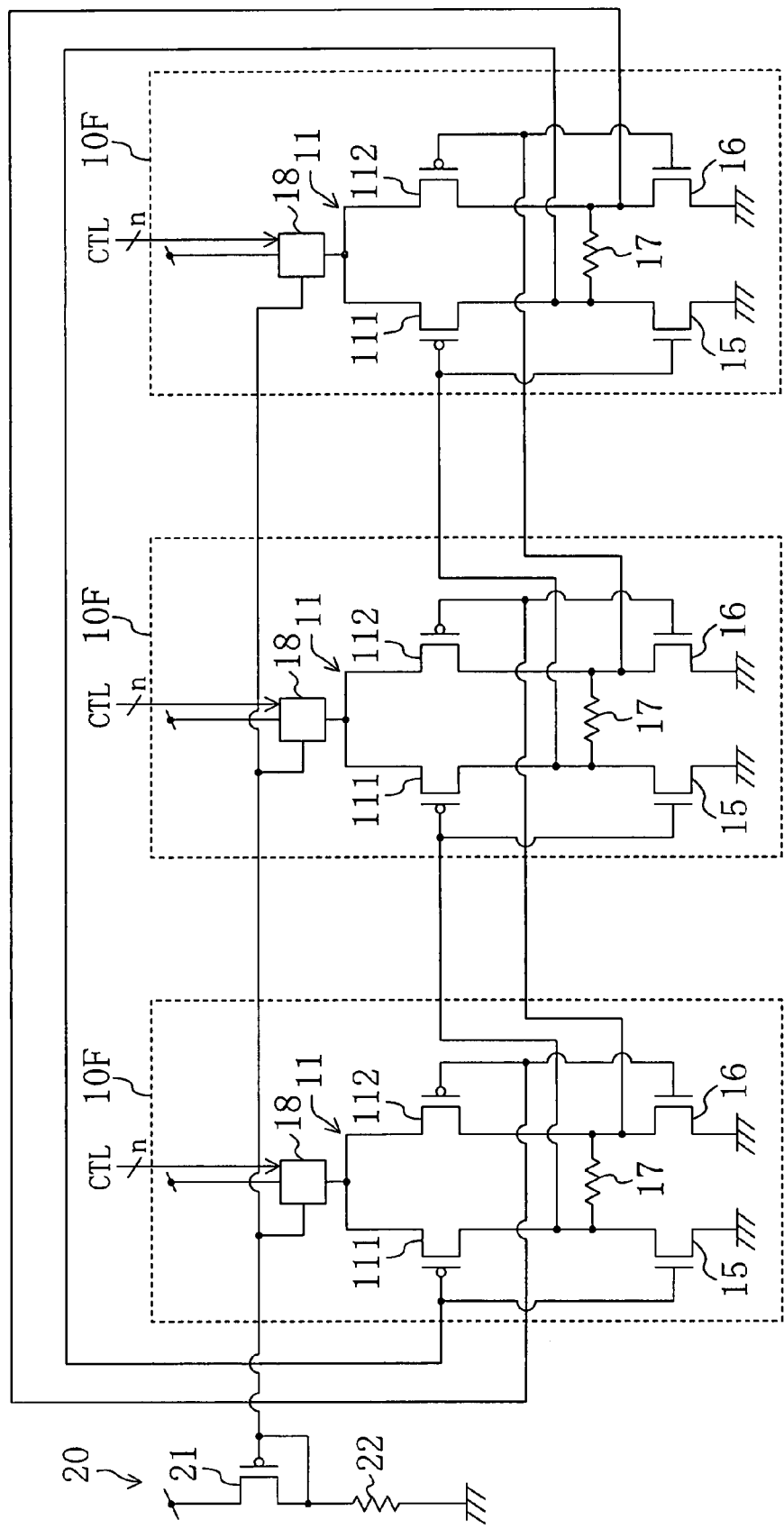
FIG. 10 is a view showing a configuration of a ring oscillator of Embodiment 6.

FIG. 10 shows a configuration of a ring oscillator of Embodiment 6 of the present invention. The ring oscillator of this embodiment is composed of three differential amplifier circuits 10F connected in a loop. Each of the differential amplifier circuits 10F is different from the differential amplifier circuit 10E shown in FIG. 8 in that NMOS transistors 15 and 16 are respectively provided in place of the resistances 13 and 14 and that a resistance 17 is newly provided to be connected to the junction point of the PMOS transistor 111 and the NMOS transistor 15 at one terminal and to the junction point of the PMOS transistor 112 and the NMOS transistor 16 at the other terminal. The switching operation of these transistors and the direction of the current flowing through the resistance 17 in response to the switching operation are as described in Embodiment 3.

Thus, in this embodiment, the number of resistances and passive circuits can be reduced compared with the ring oscillator of Embodiment 5. The circuit scale can therefore be reduced.

In the embodiments described above, the differential transistor pair 11 may be composed of two NMOS transistors. Otherwise, the differential transistor pair 11 may be composed of PNP or NPN bipolar transistors. In these alterations, also, the effect obtained according to the present invention will not be impaired.

In the embodiments described above, the passive circuits 12', 13', 14' and 17' may be connected in series with the resistances 12, 13, 14 and 17, respectively.

Embodiment 7

Figure 11:
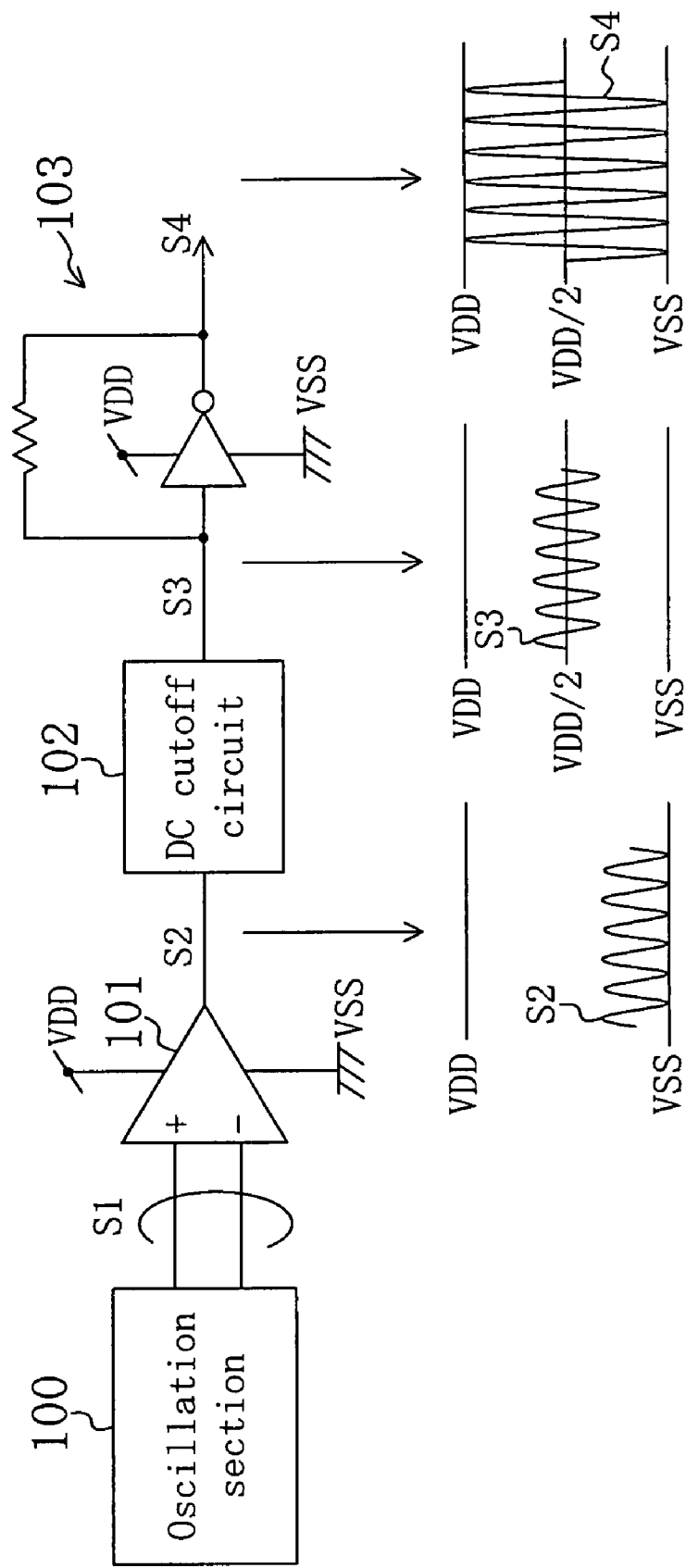
FIG. 11 is a view showing a configuration of a ring oscillator of Embodiment 7.

FIG. 11 shows a configuration of a ring oscillator of Embodiment 7 of the present invention. The ring oscillator of this embodiment includes an oscillation section 100 composed of a plurality of differential amplifier circuits (not shown) connected in a loop, an amplifier 101, a DC cutoff circuit 102 and an amplifier 103. The oscillation section 100 may be any of the ring oscillators of Embodiments 1 to 6 described above.

The amplifier 101 receives a differential signal S1 outputted from the oscillation section 100 and amplifies the received signal to output an oscillating signal S2. The DC cutoff circuit 102 receives the oscillating signal S2 and cuts off a DC component included therein to output a signal S3. The DC cutoff circuit 102 may be made of a capacitance, for example. The amplifier 103 receives the signal S3 and amplifies the received signal to output a signal S4 oscillating over the entire width between the power supply voltage VDD and the ground voltage VSS. The amplifier 103 may be made of an inverter circuit subjected to negative feedback with a resistance, for example, Thus, in this embodiment, even if the amplitude of the oscillating signal is small and the amplitude center is deviated from the position of ½ of the power supply voltage, it is possible to generate a signal oscillating over the entire width between the power supply voltage and the ground voltage with the position of ½ of the power supply voltage as the center. In this way, a ring oscillator supplying a stable oscillating signal independent of the power supply voltage can be implemented with a comparatively simple circuit configuration.

Embodiment 8

Figure 12:
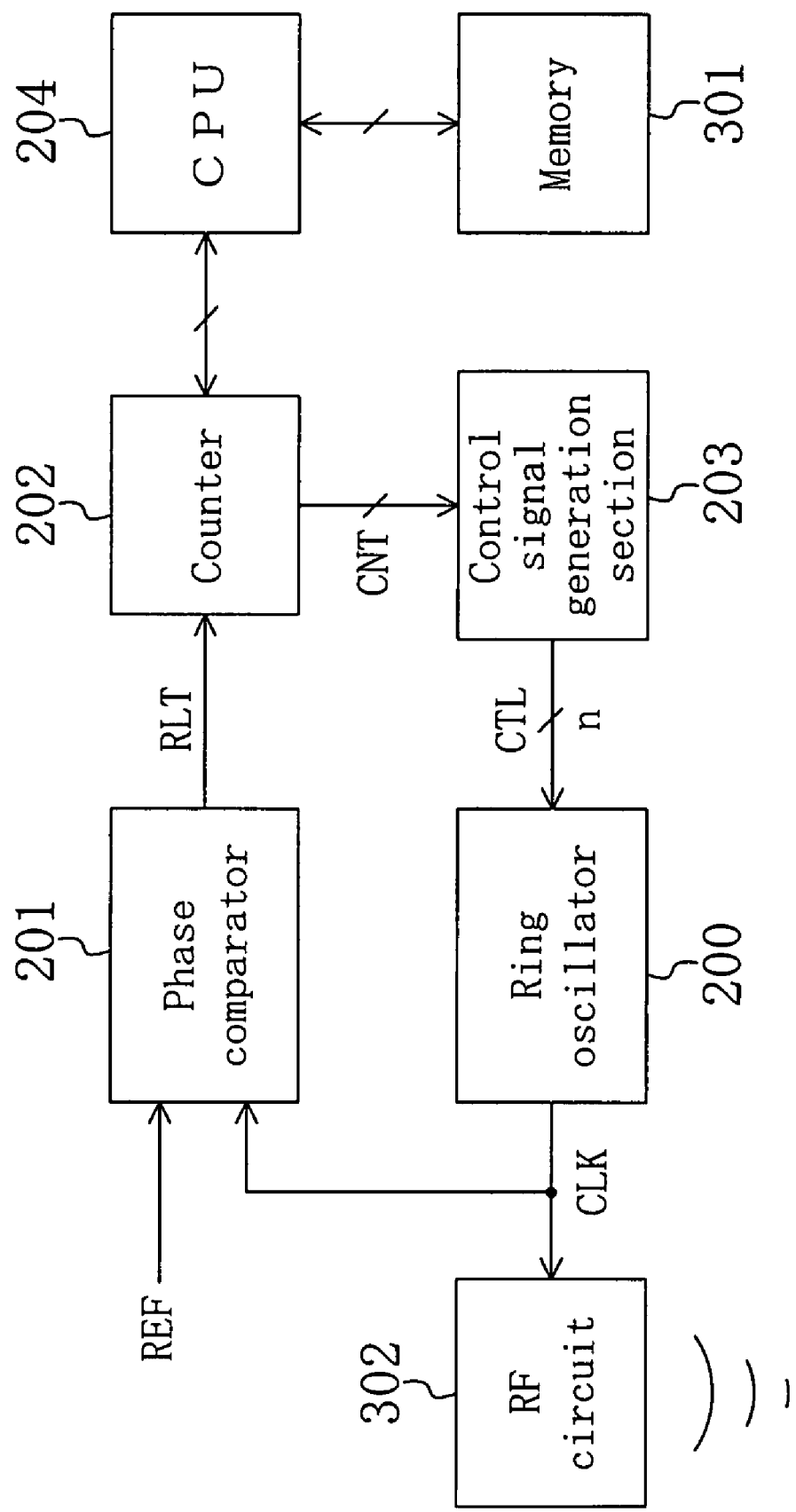
FIG. 12 is a block diagram of an electronic device of Embodiment 8.

FIG. 12 shows a configuration of an electronic device of Embodiment 8 of the pre-sent invention. The electronic device of this embodiment includes a ring oscillator 200, a phase comparator 201, a counter 202, a control signal generation section 203, a CPU 204, a memory 301 and a RF circuit 302.

The ring oscillator 200, which can be any of the ring oscillators of Embodiments 1 to 6, outputs a clock signal CLK. The phase comparator 201 compares the phase of the clock signal CLK with the phase of a supplied reference signal REF and outputs a signal RLT representing the comparison result. The counter 202 counts up or down based on the supplied signal RLT. In particular, the counter 202 starts counting from an initial value once being instructed to start counting, and retains the current count value once being instructed to stop counting. The control signal generation section 203 receives a signal CNT representing the count value of the counter 202, generates an n-bit control signal CTL based on the signal CNT, and supplies the control signal CTL to the ring oscillator 200. The oscillation frequency and oscillation amplitude in the ring oscillator 200 can be controlled with the control signal CTL, as described in the above embodiments.

Figure 13:
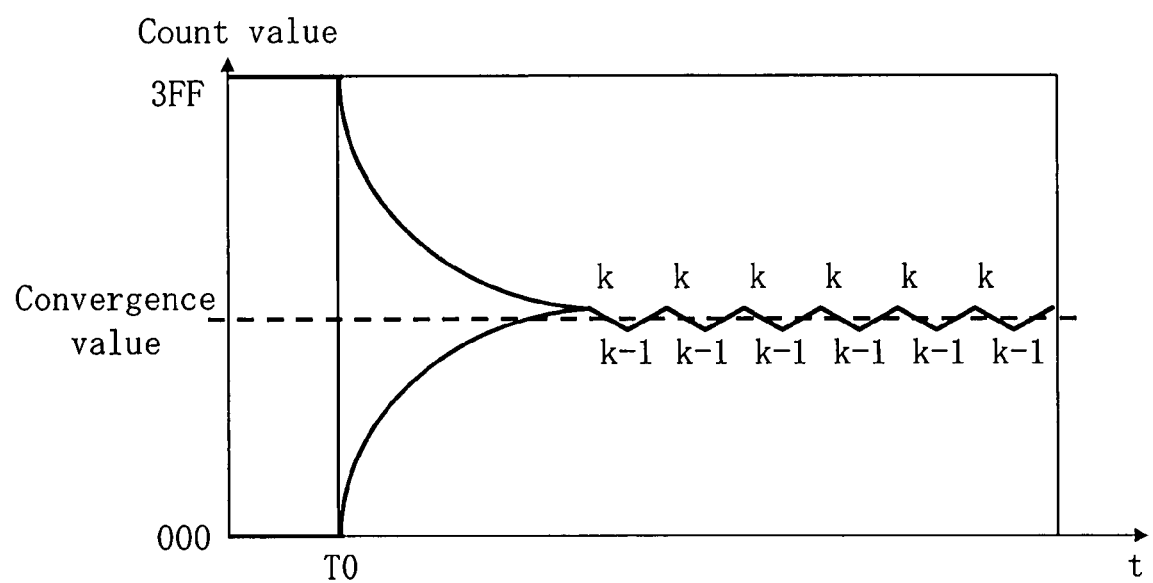
FIG. 13 is a graph illustrating convergence of a count value.

With the above configuration, the counter 202 continues counting up or down until the clock signal CLK becomes the same in phase as the reference signal REF, and around the point at which the phases match with each other, counting up and counting down are brought into a balanced state. In other words, the count value of the counter 202, starting from an initial value, converges to a value uniquely determined with the reference signal REF. FIG. 13 shows the convergence of a count value represented by 10 bits. At time T0, the counter 202 starts counting up from an initial value "0x000" or counting down from an initial value "0x3FF". The count value continues incrementing or decrementing, and after a lapse of some amount of time, starts repeating a value k and a value k-1 both in the vicinity of the convergence value alternately. In this state of convergence of the count value, the frequency of the clock signal CLK has become equal to the frequency (16 MHz, for example) of the reference signal. In this way, even if the oscillation frequency of the ring oscillator has deflections caused by fabrication variations, the ring oscillator can generate an extremely highly precise clock signal. Note that the counter 202 may start counting from a median value such as "0x200", for example, as the initial value.

Referring back to FIG. 12, the CPU 204 instructs the counter 202 to start and stop counting. The CPU 204 also stores the count value of the counter 202 in the memory 301, and later reads the stored count value from the memory 301 and supplies the read count value to the counter 202. The counter 202 then retains the count value supplied from the CPU 204. For example, during fabrication of the ring oscillator 200, adjustment (trimming) may be made so that the oscillation frequency thereof will be equal to the frequency of the reference signal REF, and the count value obtained at this adjustment may be stored in the memory 301. During normal operation of the ring oscillator 200, the value stored in the memory 301 can be read and set as the count value of the counter 202, to thereby obtain a highly precise clock signal CLK.

The RF circuit 302 operates in response to the clock signal CLK and outputs a radio signal. The RF circuit 302 may be usable as a RF transmitter in a remote keyless entry system for locking/unlocking a car door.

Figure 14:
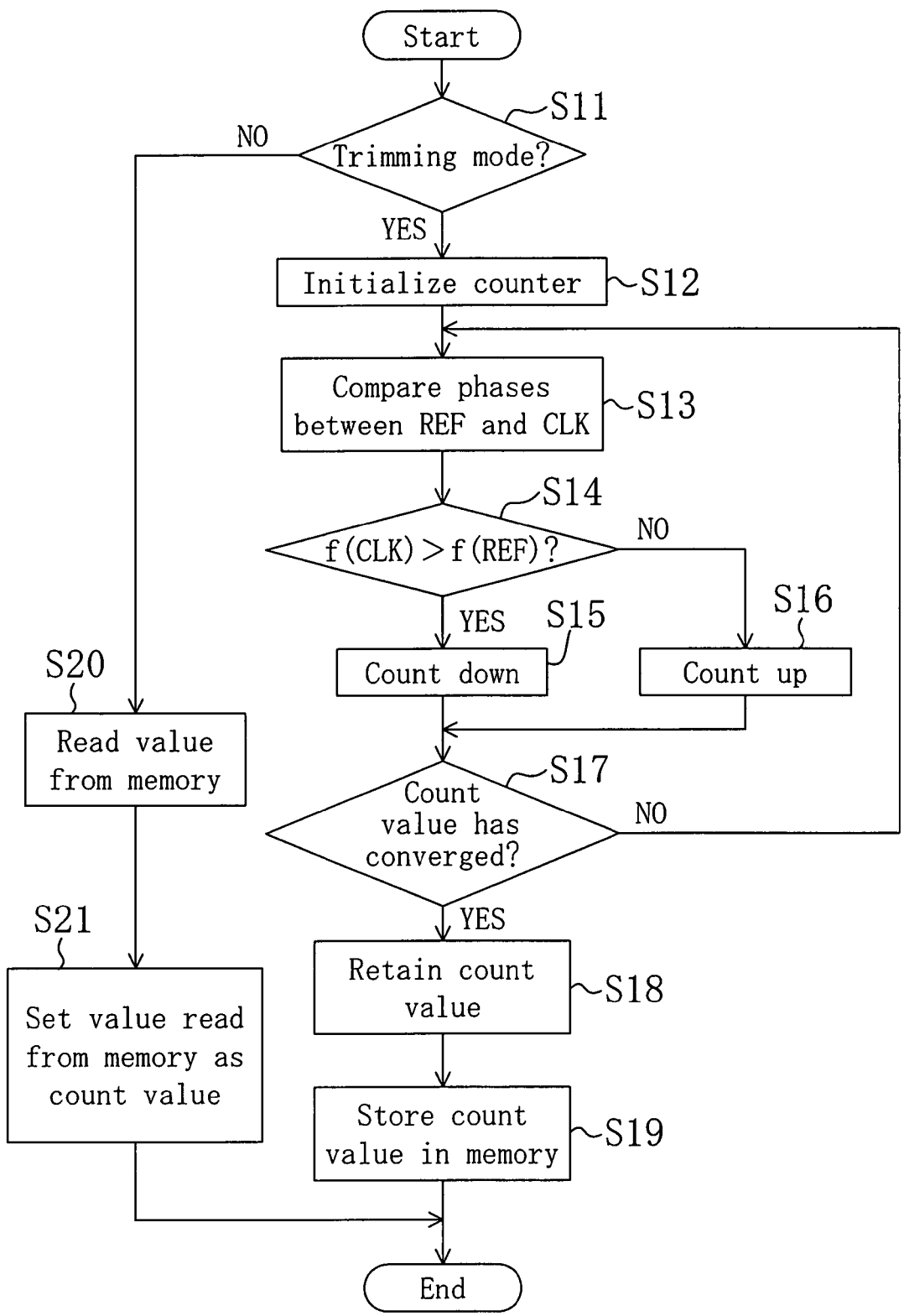
FIG. 14 is a flowchart of trimming control and normal operation control of a ring oscillator.

The trimming control and normal operation control on the ring oscillator 200 by the CPU 204 will be described with reference to the flowchart of FIG. 14. First, in step S11, whether the operation is in the trimming mode or the normal operation mode is determined. This determination can be attained by examining the state of a terminal for operation mode selection in a semiconductor integrated circuit incorporating the ring oscillator 200. For example, the CPU 204 may read the value of PORT00 and determine that the operation is in the trimming mode if the value is "0" and in the normal operation mode if it is "1".

If the trimming mode is being selected (YES in the step S11), the counter 202 is initialized (step S12) to set an initial value as the count value, and then the phase comparator 201 compares the phases of the reference signal REF and the clock signal CLK with each other (step S13). If the frequency f(CLK) of the clock signal CLK is greater than the frequency f(REF) of the reference signal REF (YES in step S14), the count value of the counter 202 is decremented (step S15) to decrease the frequency of the clock signal CLK. If the frequency f(CLK) is smaller than the frequency f(REF) (NO in step S14), the count value of the counter 202 is incremented (step S16) to increase the frequency of the clock signal CLK.

Thereafter, whether or not the count value has converged is determined (step S17). If the count value has not converged (NO in step S17), the process returns to the step S12, to repeat the above steps. The determination on convergence of the count value may be attained by actually monitoring the count value. Otherwise, the count value may be determined to have converged once a predetermined time (1 ms, for example) has elapsed, because the count value converges to a predetermined value upon a lapse of some amount of time as described above.

Once the count value has converged, the count value is retained in the counter 202 (step S18). Also, the CPU 204 reads the count value from the counter 202 and stores the read count value in the memory 301 (step S19). The trimming of the ring oscillator 200 is thus completed with the processing flow described above.

If the ring oscillator 200 operates in the normal operation mode (NO in the step S11), the CPU 204 reads the value stored in the memory 301 (step S20), and supplies the read value to the counter 202. The counter 202 retains the value as the count value (step S21). In this way, the count value obtained by the trimming is restored to the counter 202, to allow the ring oscillator 200 to generate the clock signal CLK having a desired frequency.

Thus, in this embodiment, deflections in the oscillation frequency of the ring oscillator caused by fabrication variations can be automatically corrected. Moreover, by storing the corrected value in the memory, a clock signal having a desired frequency can be obtained promptly in the normal operation mode. With such a ring oscillator excellent in noise immunity incorporated in the electronic device, it is no more necessary to provide an oscillation terminal for receiving a clock signal supplied from an external quartz oscillator or the like.

The present invention is applicable, not only to communication devices provided with a RF circuit, but also to electronic devices in general such as microcomputers that operate in response to a clock signal.

Embodiment 9

Figure 15:
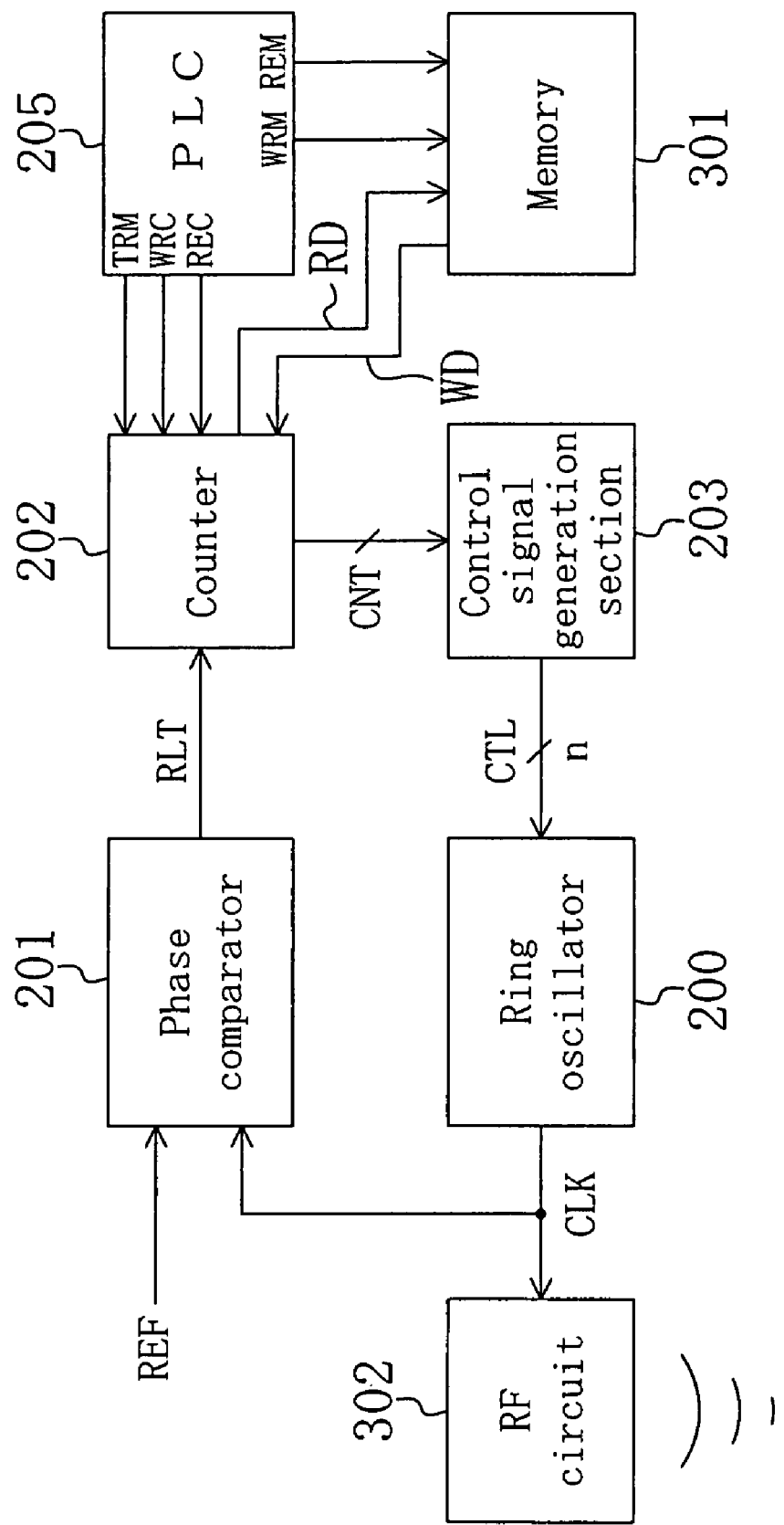
FIG. 15 is a block diagram of an electronic device of Embodiment 9.

FIG. 15 shows a configuration of an electronic device of Embodiment 9 of the pre-sent invention. The electronic device of this embodiment is different from the electronic device shown in FIG. 12 in that a programmable logic controller (PLC) 205 replaces the CPU 204. While Embodiment 8 adopts a software control scheme in which the CPU 204 performs the trimming and normal operation controls on the ring oscillator 200, this embodiment adopts a hardware control scheme in which the PLC 205 performs these controls. Hereinafter, only the point different from Embodiment 8 will be described.

The PLC 205 controls the operation of the counter 202 with signals TRM, WRC and REC and controls the operation of the memory 301 with signals WRM and REM. If the signal TRM is active (logic value "1", for example), the counter 202 counts up or down to perform trimming of the ring oscillator 200. If the signal TRM is inactive (logic value "0", for example), the counter 202 stops counting and retains the count value. If the signals REC and WRM are active, the counter 202 outputs the count value to a data line RD, and the memory 301 stores therein the value outputted to the data line RD. If the signals WRC and REM are active, the memory 301 outputs the stored value to a data line WD, and the counter 202 receives the value outputted to the data line WD and retains the received value as the count value.

The trimming and normal operation controls on the ring oscillator 200 by the PLC 205 are substantially the same as those described above with reference to FIG. 14. Note however that the signals outputted from the PLC 205 are (TRM, WRC, REC, WRM, REM)=(1, 0, 0, 0, 0) in the steps S11 through S17, and (TRM, WRC, REC, WRM, REM)=(0, 0, 1, 1, 0) in the steps S18 and S19, and (TRM, WRC, REC, WRM, REM)=(0, 1, 0, 0, 1) in the steps S20 and S21.

Figure 16A:
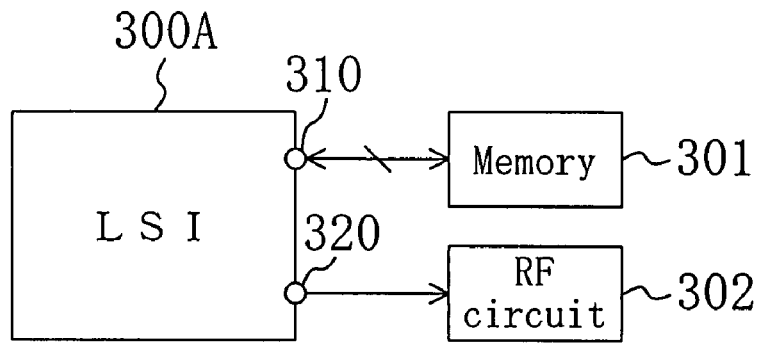
FIGS. 16A to 16C are views showing variations of an electronic device of the pre-sent invention.
Figure 16B:
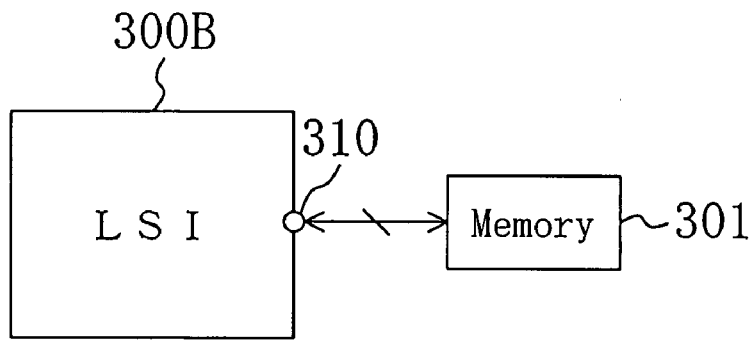
Figure 16C:
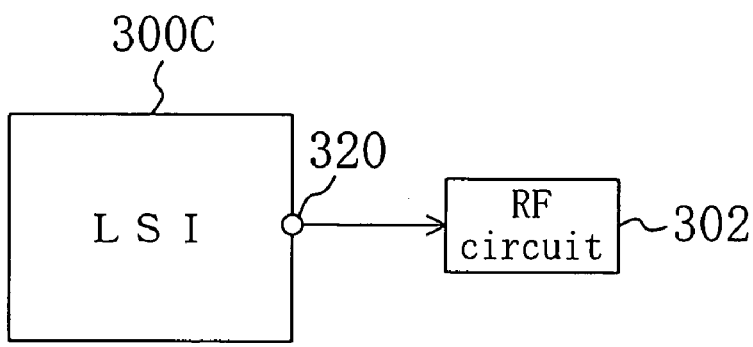

The components of each of the electronic devices of Embodiments 8 and 9 can be mounted in one semiconductor integrated circuit. Alternatively, as shown in FIG. 16A, the components other than the memory 301 and the RF circuit 302 may be mounted in a semiconductor integrated circuit 300A, and the semiconductor integrated circuit 300A may be connected with the memory 301 and the RF circuit 302 via interfaces 310 and 320. Otherwise, as shown in FIG. 16B, the components other than the memory 301 may be mounted in a semiconductor integrated circuit 300B, and the semiconductor integrated circuit 300B may be connected with the memory 301 via the interface 310. Likewise, as shown in FIG. 16C, the components other than the RF circuit 302 may be mounted in a semiconductor integrated circuit 300C, and the semiconductor integrated circuit 300C may be connected with the RF circuit 302 via the interface 320.

What is claimed is:

1. A ring oscillator comprising a plurality of differential amplifier circuits connected in a loop, each of the differential amplifier circuits comprising:

a differential transistor pair composed of first and second transistors;

a first resistance connected to a junction point of the first and second transistors at one terminal and to a first voltage node at the other terminal; and second and third resistances provided between the first and second transistors, respectively, and a second voltage node, wherein the first to third resistances are all negative resistance elements for temperature compensation.

2. The ring oscillator of claim 1, wherein each of the plurality of differential amplifier circuits further comprises first and second passive circuits connected to the second and third resistances, respectively, the load characteristics of the passive circuits changing according to a control signal supplied.

3. The ring oscillator of claim 2, wherein the first and second passive circuits are both variable resistance circuits whose resistance value changes according to the control signal or variable capacitance circuits.

4. The ring oscillator of claim 1, wherein each of the plurality of differential amplifier circuits further comprises a variable resistance circuit connected to the first resistance, the resistance value of the variable resistance circuit changing according to a control signal supplied.

5. A semiconductor integrated circuit comprising:
the ring oscillator of claim 2;
a phase comparator for comparing a phase of an output signal of the ring oscillator with a phase of a reference signal;
a counter for counting up or down based on the result of the phase comparison, the counter starting the counting from an initial value and retaining a current count value when the counter stops the counting; and
a control signal generation section for generating the control signal according to the count value of the counter.

6. The semiconductor integrated circuit of claim 5, further comprising:
a first interface for inputting/outputting a value from/to an external memory for retaining the value supplied;
a control section for instructing the counter to start or stop counting and transferring a value between the counter and the external memory via the first interface when the counting of the counter is at rest; and
a second interface for outputting an oscillating signal from the ring oscillator externally,
wherein when receiving a count value from the control section, the counter retains the received count value.

7. The semiconductor integrated circuit of claim 5, further comprising:
an interface for inputting/outputting a value from/to an external memory for retaining the value supplied;
a control section for instructing the counter to start or stop counting and transferring a count value between the counter and the external memory via the interface when the counting of the counter is at rest; and
a RF circuit operating in response to an oscillating signal from the ring oscillator,
wherein when receiving a count value from the control section, the counter retains the received count value.

8. The semiconductor integrated circuit of claim 5, further comprising:
a memory for retaining a value supplied; and
a control section for instructing the counter to start or stop counting and transferring a count value between the counter and the memory when the counting of the counter is at rest,
wherein when receiving a count value from the control section, the counter retains the received count value.

9. The semiconductor integrated circuit of claim 8, further comprising
an interface for outputting an oscillating signal from the ring oscillator externally.

10. The semiconductor integrated circuit of claim 8, further comprising
a RF circuit operating in response to an oscillating signal from the ring oscillator.

11. An electronic device comprising:
the semiconductor integrated circuit of claim 6;
the memory; and
a RF circuit operating in response to the oscillating signal outputted via the second interface.

12. An electronic device comprising:
the semiconductor integrated circuit of claim 7; and
the memory.

13. An electronic device comprising:
the semiconductor integrated circuit of claim 9; and
a RF circuit operating in response to the oscillating signal outputted via the interface.

14. An electronic device comprising:
the semiconductor integrated circuit of claim 10.

* * * * *